United States Patent
Lee et al.

(10) Patent No.: US 9,112,073 B2
(45) Date of Patent: Aug. 18, 2015

(54) PHOTO DETECTOR

(71) Applicant: NATIONAL TAIWAN UNIVERSITY, Taipei (TW)

(72) Inventors: Si-Chen Lee, Taipei (TW); Hung-Hsin Chen, Taipei (TW); Shih-Yen Chen, Hsinchu (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 14/468,451

(22) Filed: Aug. 26, 2014

(65) Prior Publication Data

US 2015/0200348 A1  Jul. 16, 2015

(30) Foreign Application Priority Data

Jan. 13, 2014  (TW) ............................. 103101189 A

(51) Int. Cl.
*H01L 37/02* (2006.01)

(52) U.S. Cl.
CPC .................................. *H01L 37/025* (2013.01)

(58) Field of Classification Search
CPC ..... H01L 33/50; H01L 33/502; H01L 33/501; H01L 31/02024; H01L 27/14; H01L 27/1443; H01L 27/1461; H01L 27/3227; H01L 31/0468; H01L 51/447; H01L 51/448
See application file for complete search history.

(56) References Cited

U.S. PATENT DOCUMENTS

| 6,713,832 | B2 | 3/2004 | Pardo et al. |
| 7,496,122 | B2 | 2/2009 | Bozso et al. |
| 7,679,749 | B2 | 3/2010 | Lin et al. |
| 2014/0319357 | A1 * | 10/2014 | Ogawa et al. ................. 250/349 |

FOREIGN PATENT DOCUMENTS

TW  200804810  1/2008

* cited by examiner

*Primary Examiner* — Thanh Y Tran
(74) *Attorney, Agent, or Firm* — Huffman Law Group, PC

(57) ABSTRACT

A photo detector is disclosed. The photo detector comprises a substrate, a flat metal layer, a dielectric layer, a patterned metal layer, and a semiconductor film. The flat metal layer is formed on the substrate. The dielectric layer is formed on the flat metal layer. The patterned metal layer is formed on the dielectric layer. The patterned metal layer comprises a first interdigitated electrode and a second interdigitated electrode. The first interdigitated electrode is adjacent to the second interdigitated electrode. The semiconductor film is formed on the dielectric layer and covering the first interdigitated electrode and the second interdigitated electrode. When the semiconductor film receives an incident light, the flat metal layer and the patterned metal layer are operated in a localized surface plasmon mode or a waveguide mode for absorbing a certain narrow bandwidth radiation light of the incident light. Therefore, the electrical conductivity of the semiconductor film is changed and the optical energy absorbed by the photo detector is determined.

42 Claims, 7 Drawing Sheets

PHOTO DETECTOR

BACKGROUND OF THE INVENTION

1. Field of the Invention

This invention generally relates to a photo detector, and more particularly, to a photo detector being used to detect the narrow bandwidth light energy.

2. Description of the Prior Art

With the rapid development of the human life style and the industries, fossil fuels are extensively used which results in the serious problem of air pollution. Hence, detecting the environmental gas has attracted more and more attentions in recent years. Due to the different molecular vibration spectra, a gas usually has strong absorption at one or more narrow bandwidth infrared wavelengths. The infrared detection system was the conventional optical method to detect the gas which consists of a broad band infrared light source, a detection chamber and a broad band photo detector. The photo detector with the narrow bandwidth absorption is expected to improve the detection sensitivity and decrease the system size.

At present, the infrared detector with narrow bandwidth absorption can be roughly divided into three types. The first type uses the semiconductor epitaxy technique to manufacture III-V quantum-well, quantum dot or quantum ring structure, and to cooperate the back-end process to perform the infrared detection element, and the infrared detector manufactured by the method adjust the structure parameters and the element proportion so as to adjust the detection wavelength. However, the infrared detector must be operated in low temperature environment and the process equipment is expensive.

The second type uses an infrared detector with full band (for example, the thermal pile) and sets an optical filter in front of the infrared detector for achieving to detect infrared light with narrow bandwidth. Although the infrared detector of the second type can operate in the room temperature environment, the use of the optical filter increases the system size and the manufacture cost.

The third type uses the infrared thermal imager manufactured by the semiconductor process and the micro electro mechanical system (MEMS), and the infrared thermal imager is also a resistive optical detector comprising a substrate and an amorphous silicon film. Specifically, the infrared absorption material is applied on the top of amorphous silicon film, the bottom of the amorphous silicon film is hollowed, and two sides thereof respectively mount a cantilever connected to the substrate that is used to the mechanical support and the electrical measure point. When the resistive optical detector receives the infrared light, the temperature of amorphous silicon film is changed, so as to change the electrical conductivity of the amorphous silicon film, and therefore, the resistance of amorphous silicon film is measured to achieve the infrared detection. Although this kind of the infrared detector is operated in the room temperature environment, it completely absorbs any light waveband without the limitation condition, and therefore, the kind of the infrared detector need to incorporate an optical filter to filter the undesired light waveband. As a result, the system size and the manufacturing cost are increased, and the use of cantilever structure reduces the effective area of the element so as to affect the operation efficiency.

For the reason that the conventional photo detector could not avoid to increase the system size in order to detect the narrow bandwidth light, a novel scheme is proposed that may adaptively avoid increasing the system size and detecting the narrow bandwidth.

SUMMARY OF THE INVENTION

In view of the foregoing, it is the goal of the present invention to provide a photo detector with the narrow bandwidth detection which has the characteristics of small size and high detection accuracy.

According to one embodiment of the present invention, the photo detector is disclosed. The photo detector comprises: a substrate; a flat metal layer formed on the substrate; a dielectric layer formed on the flat metal layer; a patterned metal layer formed on the dielectric layer and comprising a first interdigitated electrode and a second interdigitated electrode, wherein the first interdigitated electrode is adjacent to the second interdigitated electrode; and a semiconductor film formed on the dielectric layer and covering the first interdigitated electrode and the second interdigitated electrode; wherein when the semiconductor film receives an incident light, the flat metal layer and the patterned metal layer are operated in the localized surface plasmon mode or a waveguide mode for absorbing a certain narrow bandwidth radiation light of the incident light, and therefore, the electrical conductivity of the semiconductor film is changed and the optical energy absorbed by the photo detector is determined.

According to another embodiment of the present invention, the photo detector is disclosed. The photo detector comprises: a substrate; a flat metal layer formed on the substrate; a dielectric layer formed on the flat metal layer; a pattern metal layer formed the dielectric layer and comprising a first interdigitated electrode, a second interdigitated electrode and a plurality of island metal structures, wherein the plurality of island metal structures are located between the first interdigitated electrode and the second interdigitated electrode; and a semiconductor film, formed on the dielectric layer, covering the first interdigitated electrode, the second interdigitated electrode and plurality of island metal structures; wherein when the semiconductor film receives an incident light, the flat metal layer and the plurality of island metal structures are operated in a localized surface plasmon mode or a waveguide mode for absorbing a certain narrow bandwidth radiation light of the incident light, and therefore, the electrical conductivity of the semiconductor film is changed and the optical energy absorbed by the photo detector is determined.

According to the other embodiment, the photo detector is disclosed. The photo detector comprises: a substrate; a flat metal layer formed on the substrate; a patterned dielectric layer distributed on the flat metal layer; a patterned metal layer formed on the patterned dielectric layer; and a semiconductor film formed on the flat metal layer and covering the patterned dielectric layer and the patterned metal layer; wherein when the semiconductor film receives an incident light, the flat metal layer and the patterned metal layer are operated in a localized surface plasmon mode or a waveguide mode for absorbing a certain narrow bandwidth radiation light of the incident light, and therefore, the electrical conductivity of the semiconductor film is changed and the optical energy absorbed by the photo detector is determined.

Thereby, the photo detector of the present invention uses three-layer structure (metal/dielectric/metal) to operate in the localized surface plasmon mode or a waveguide mode for absorbing a certain narrow bandwidth radiation light of the incident light, and deposit a semiconductor film on the interdigitated electrode to be as the resistance temperature detector.

BRIEF DESCRIPTION OF THE DRAWINGS

The accompanying drawings incorporated in and forming a part of the specification illustrate several aspects of the present invention, and together with the description serve to explain the principles of the disclosure. In the drawings.

DETAILED DESCRIPTION OF THE PREFERRED EMBODIMENTS

Some embodiments of the present invention will now be described in greater detail. Nevertheless, it should be noted that the present invention can be practiced in a wide range of other embodiments besides those explicitly described, and the scope of the present invention is expressly not limited except as specified in the accompanying claims.

Moreover, some irrelevant details are not drawn in order to make the illustrations concise and to provide a clear description for easily understanding the present invention.

Figure 1A:
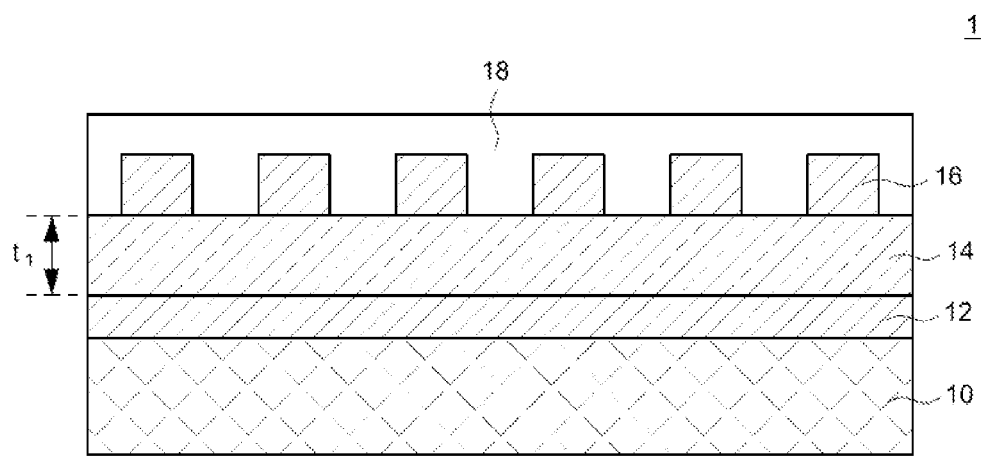
FIG. 1A illustrates a schematic diagram of a photo detector according to the first embodiment of the present invention.

Referring to FIG. 1A, which illustrates a photo detector according to the first embodiment of the present invention. As shown in FIG. 1A, the photo detector 1 comprises a substrate 10, a flat metal layer 12, a dielectric layer 14, a patterned metal layer 16 and a semiconductor film 18. The flat metal layer 12 is formed on the substrate 10, and the dielectric layer 14 is formed on the flat metal layer 12. The patterned metal layer 16 is form on the dielectric layer 14, and the semiconductor film 18 is formed on the dielectric layer 14 and covers the pattern metal layer 16.

The photo detector 1 is manufactured by the semiconductor process, and the steps of the semiconductor comprise: a substrate 10 is mounted firstly, and then the flat metal layer 12 is deposited on the substrate 10. Moreover, the dielectric layer 14 is deposited on the flat metal layer 12. Next, the photolithography and the metal evaporation process are performed on the surface of the dielectric layer 14 so as to define the pattern structure on the pattern metal layer 16. Lastly, the substrate 10 with the pattern metal layer 16 is mounted in the plasma enhancement chemical vapor deposition (PECVD) equipment to deposit the semiconductor film 18 on the dielectric layer 14 so as to allow the semiconductor film 18 to cover the dielectric layer 14.

According to one embodiment, the substrate 10 is the silicon substrate, the gallium nitrite substrate, the GaAs substrate, the oxide substrate, the glass substrate, the ceramic substrate, the flexible substrate or other material by the mechanical support. The flat metal layer 12 and the patterned metal layer 16 materials have light reflection and electrical conductivity characteristics, for example, the flat metal layer and the patterned metal layer may comprise Au, Ag, Al, Pt, Cr, Ti, W, Ta, Cu, Co, Ni, Fe or Mo. The material of the dielectric layer 14 is $SiO_2$, $Si_3N_4$, $Al_2O_3$ or other dielectric material with insulation. The material of the semiconductor film 18 is monocrystalline silicon, polycrystalline silicon, amorphous silicon, microcrystalline silicon, Ge, SiGe, ZnO, VO or other semiconductor material having the characteristic of the electronic property varied with the temperature.

Figure 1B:
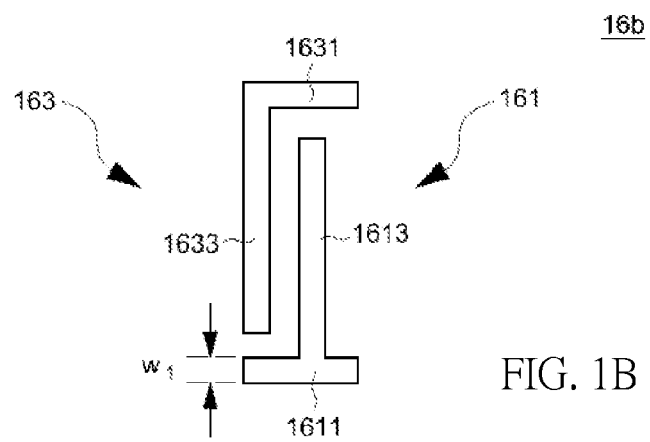
FIG. 1B illustrates a top view of pattern metal layer of the photo detector according to first embodiment of the present invention.

According to one embodiment, the thicknesses of the flat metal layer is 10~200 nanometer. The thickness $t_1$ of the dielectric layer 14 is 0.1~400 nanometer, or 0.1 nanometer~3 micrometer. The thickness of the semiconductor film 18 is 10~500 nanometer The patterned metal layer 16 is shown in FIG. 1B, and the FIG. 1B illustrates a top view of patterned metal layer of the photo detector according to first embodiment of the present invention. According to one embodiment, the patterned metal layer 16b comprises a first interdigitated electrode 161 and a second interdigitated electrode 163, and the first interdigitated electrode 161 is adjacent to the second interdigitated electrode 163, and the first interdigitated electrode 161 is electrically connected to the second interdigitated electrode 163 via the semiconductor film 18. The first interdigitated electrode 161 comprises a first bar portion 1611 and a first finger portion 1613, and one terminal of the first finger portion 1613 is connected to one side of the first bar portion 1611, and the second interdigitated electrode 163 comprises a second bar portion 1631 and a second finger portion 1633, one terminal of the second finger portion 1633 is connected to one side of the second bar portion 1631, and the first bar portion 1611 is relative to the second bar portion 1631, and the first finger portion 1613 is relative to the second finger portion 1633.

The line width $w_1$ of the first bar portion 1611, the first finger portion 1613, the second bar portion 1631 or the second finger portion 1633 is 0.1~100 micrometer. The gap between the first finger portion 1613 and the second finger portion 1633 is 0.1~500 micrometer.

Figure 1C:
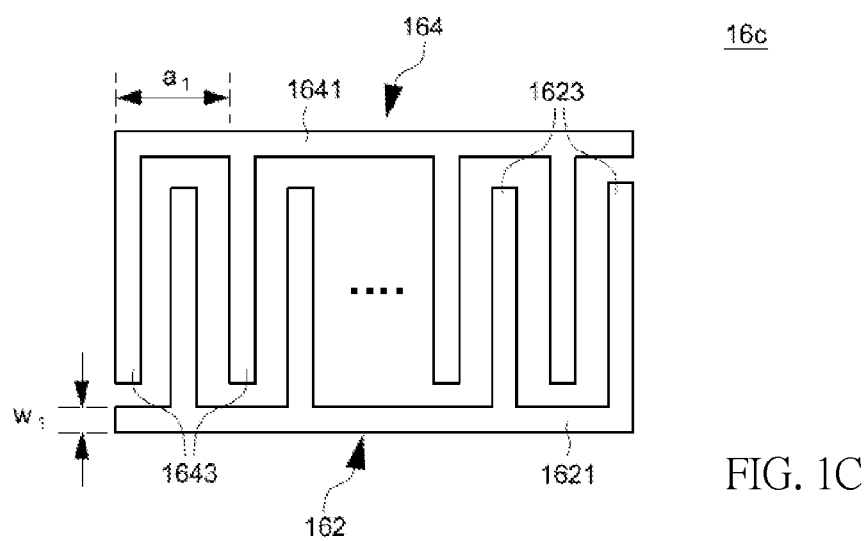
FIG. 1C illustrates a top view of pattern metal layer of the photo detector according to first embodiment of the present invention.

The patterned metal layer 16 is shown in FIG. 1C, and the FIG. 1C illustrates a top view of patterned metal layer of the photo detector according to first embodiment of the present invention. According to another embodiment, the pattern metal layer 16c comprises the first interdigitated electrode 162 and a second interdigitated electrode 164. The first interdigitated electrode 162 is adjacent to the second interdigitated electrode 164. The first interdigitated electrode 162 comprises a first bar portion 1621 and a plurality of first finger portions 1623, one terminal of each first finger portion 1623 is connected to one side of the first bar portion 1621, and the period of each of the plurality of first finger portions 1623 is $a_1$. The second interdigitated electrode 164 comprises a second bar portion 1641 and a plurality of second finger portions 1643, and one terminal of each second finger portion 1643 is connected to one side of the second bar portion 1641. The period of each of the plurality of second finger portions 1643 is $a_1$. The first bar portion 1621 is relative to the second bar portion 1641, and the plurality of first finger portions 1623 and the plurality of finger portions 1643 are place at regular intervals.

The line width of the each first finger portion 1623 or the each second finger portions 1643 is 0.1~100 micrometer, and the period $a_1$ thereof is 0.2~1000 micrometer. The gap between the first finger portion 1623 and the second finger portion 1643 is 0.1~500 micrometer.

By adopting the dielectric layer 14 with different refractive index, adjusting the thickness $t_1$ of the dielectric layer 14, the pattern size (line width $w_1$) of the patterned metal layer 16, the photo detector 1 is adjusted to absorb the light with different certain narrow bandwidth, for example, the single band or the multi band. Beside, by designing the thickness $t_1$ of the dielectric layer 14, it allows the patterned metal layer 16 (16b, 16c) and the flat metal layer 12 are operated in different modes, for example, the localized surface plasmon mode or the waveguide mode.

When the semiconductor film 18 receives the incident light, the patterned metal layer 16 operated in the different modes heats the semiconductor film 18 which covers the pattern metal layer 16, so as to change the temperature of the semiconductor film 18, and the electrical conductivity thereof is varied with the temperature. The DC bias is applied to the first electrode (161, 162) and the second electrode (163, 164), and then the current value of the semiconductor film 18 under the fixed bias is measured to obtain the resistance of the semiconductor film 18 and the optical energy absorbed by the photo detector 1. Thereby, the purpose of absorbing the light with the narrow bandwidth is achieved without using the optical filters, this method not only reduces the size of the photo detector 1 and saves the cost of using optical filters, but also have good photo detection sensitivity and accuracy. The present invention does not use the cantilever structure, and adopts the proper size design of the metal electrode to allow the first interdigitated electrode and the second interdigitated electrode to be as the adopting area so as to increase the absorbing light effective area of the element.

For instance, when the thickness $t_1$ of the dielectric layer 14 is designed between 0.1 nanometer and the 400 nanometer, the patterned metal layer 16 (16b, 16c) and the flat metal layer 12 are operated in the localized surface plasmon mode. When the thickness $t_1$ of the dielectric layer 14 is designed between 0.1 nanometer and the 3 micrometer, the pattern metal layer 16 (16b, 16c) and the flat metal layer 12 are operated in the waveguide mode.

The photo detector 1 operated in the waveguide mode has the characteristic of selectivity polarization. Specifically, the pattern metal layer 16 (16b, 16c) comprising the interdigitated electrodes (the first electrode (161, 162) and the second electrode (163, 164) can be as the electrode, and also can be as the metal grating. Under the TE mode (the electric field of the incident light is parallel to the metal grating), the incident light will propagate and reflect between the patterned metal layer 16 (16b, 16c) and the flat metal layer 12, and therefore, the incident light matching the constructive interference condition will be absorbed.

Beside, the pattern metal layer 16 (16b, 16c) and the flat metal layer 12 operated under the localized surface plasmon mode allows the photo detector 1 to have the characteristic of selectivity polarization. Specifically, the patterned metal layer 16 (16b, 16c) comprising the first interdigitated electrodes (the first electrode (161, 162) and second electrode (163, 164)) can not only be as the electrode, but also be as the absorbing structure. Under the TM mode (the electric field of the incident light is perpendicular to the metal grating), there is the resonance in the localized surface plasmon mode between the patterned metal layer 16 (16b, 16c) and the flat metal layer 12 and therefore, the incident light matching the resonance mode will be absorbed.

Figure 2A:
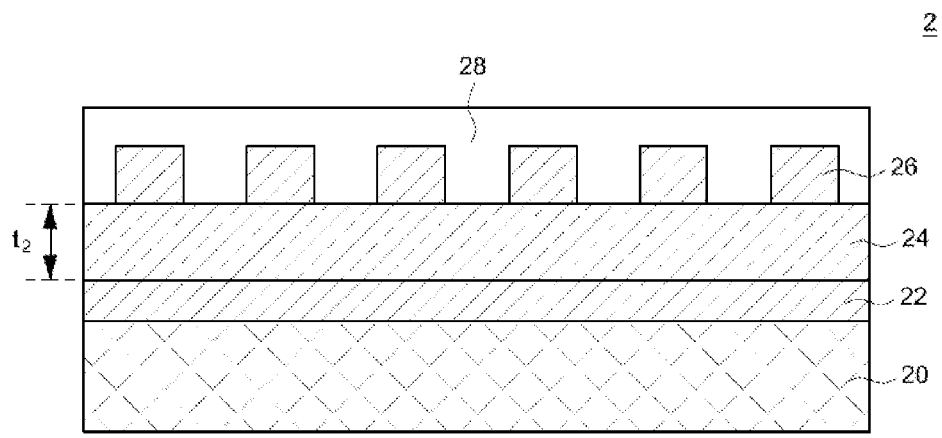
FIG. 2A illustrates a photo detector according to second embodiment of the present invention.

Referring to FIG. 2A, which illustrates a photo detector according to second embodiment of the present invention. As shown in FIG. 2, the structure, process and detecting optical principle of the photo detector 2 in the second embodiment is similar to the photo detector 1 in the first embodiment. The photo detector 2 comprises a substrate 20, a flat metal layer 22, a dielectric layer 24, a patterned metal layer 26 and a semiconductor film 28. Thereby, the difference between the photo detector 2 and the photo detector 1 is that the patterned metal layer 26 in the photo detector 2 not only includes the first interdigitated electrode and the second interdigitated electrode, but also it further includes the island metal structures independently distributed on the first interdigitated electrode and the second interdigitated electrode. When the semiconductor film 28 receives an incident light, the flat metal layer 22 and the plurality of island metal structures are operated in a localized surface plasmon mode or a waveguide mode for absorbing a certain narrow bandwidth radiation light of the incident light, and therefore, the electrical conductivity of the semiconductor film 28 is changed and the optical energy absorbed by the photo detector 2 is determined.

Figure 2B:
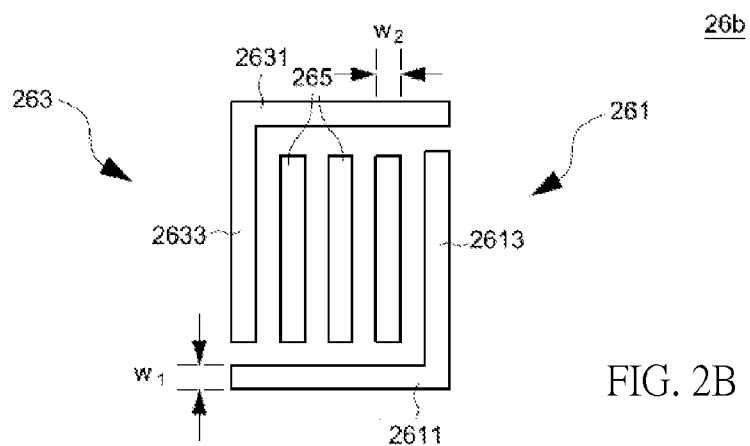
FIG. 2B illustrates the top view of the pattern metal layer in the photo detector according to the second embodiment of the present invention.

The patterned metal layer 26 is shown in FIG. 2B according to one embodiment, and the FIG. 2B illustrates the top view of the patterned metal layer in the photo detector according to the second embodiment of the present invention. The patterned metal layer 26b comprises the first interdigitated electrode 261, a second interdigitated electrode 263 and a plurality of island metal structures 265. The first interdigitated electrode 261 is electrically connected to the second interdigitated electrode 263 via the semiconductor film 28. The first interdigitated electrode 261 comprises a first bar portion 2611 and a first finger portion 2613, and one terminal of the first finger portion 2613 is connected to one side of the first bar portion 2611. The second interdigitated electrode 263 comprises a second bar portion 2631 and a second finger portion 2633, one terminal of the second finger portion 2633 is connected to one side of the second bar portion 2631, and the first bar portion 2611 is relative to the second bar portion 2631, and the first finger portion 2613 is relative to the second finger portion 2633.

Each of the plurality of island metal structures is rectangular and the plurality of island metal structures are located between the first interdigitated electrode 261 and a second interdigitated electrode 263. Specifically, the line widths $w_2$ of the plurality of island structure 265 with rectangular are similar to the line width $w_1$ of the finger portion 2613 and the second finger portion 2633, and the plurality of island metal structures are respectively parallel to the first finger portion 2613 and the second finger portion 2633.

Figure 2C:
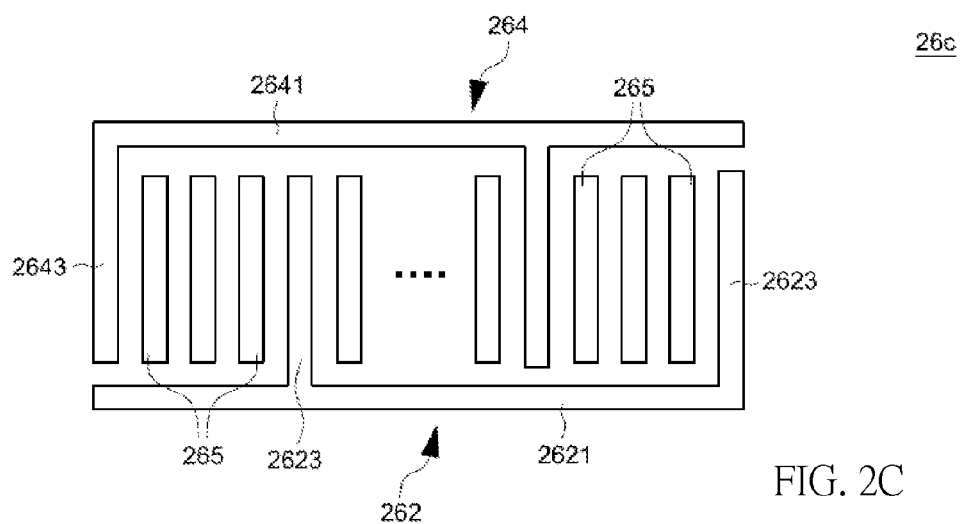
FIG. 2C illustrates a top view of the pattern metal layer in the photo detector according to the second embodiment.

The patterned metal layer is also shown in FIG. 2C according to another embodiment, and the FIG. 2C illustrates a top view of the patterned metal layer in the photo detector according to the second embodiment. The patterned metal layer 26c comprises the first interdigitated electrode 262, a second interdigitated electrode 264 and a plurality of island metal structures 265. The first interdigitated electrode 262 comprises a first bar portion 2621 and a plurality of first finger portions 2623, one terminal of each first finger portion 2623 is connected to one side of the first bar portion 2621, and the second interdigitated electrode 264 comprises a second bar portion 2641 and a plurality of second bar portions 2643, one terminal of each second finger portion 2643 is connected to one side of the second bar portion 2641. The first bar portion 2621 is relative to the second bar portion 2641, and the plurality of finger portions 2623 and the plurality of the finger portions 2643 are placed at regular intervals. Each of the plurality of the island metal structures is located between a pair of the first finger portion 2623 and the second finger portion 2643.

Each of the plurality of island metal structures 265 is rectangular and the plurality of the island metal structures 265 are located between the first interdigitated electrode 262 and a second interdigitated electrode 264. Specifically, the line widths $w_2$ of the plurality of island structure 265 with rectangular are similar to the line width $w_1$ of the finger portion 2623 and the second finger portion 2643, and the plurality of island metal structures 265 are respectively parallel to the first finger portion 2623 and the second finger portion 2643.

The embodiment is similar to the first embodiment, by adopting the dielectric layer 24 with different refractive index, adjusting the thickness $t_2$ of the dielectric layer 24, the pattern size (line width $w_2$) of the pattern metal layer 26 (26b, 26c), the photo detector 2 is adjusted to absorb the light with different certain narrow bandwidth, for example, the single band or the multi band. Beside, by designing the thickness $t_2$ of the dielectric layer 24, it allows the plurality of island metal structure 265 and the flat metal layer 22 are operated in different modes, for example, the localized surface plasmon mode or the waveguide mode.

For instance, when the thickness $t_1$ of the dielectric layer 24 is designed between 0.1 nanometer and the 400 nanometer, the island metal structures 265 with rectangular of the pattern metal layer 26 (26b, 26c) and the flat metal layer 22 are operated in the localized surface plasmon mode. When the thickness $t_2$ of the dielectric layer 24 is designed between 0.1 nanometer and the 3 micrometer, the patterned metal layer 26 (26b, 26c) and the flat metal layer 22 are operated in the waveguide mode.

The photo detector 2 operated in the waveguide mode has the characteristic of selectivity polarization. Specifically, the island metal structures 256 with rectangular can be as the metal grating. Under the TE mode (the electric field of the incident light is parallel to the metal grating), the incident light will propagate and reflect between the island metal structures 265 and the flat metal layer 22, and therefore, the incident light matching the constructive interference condition will be absorbed.

Beside, the photo detector 2 operated under the localized surface plasmon mode has the characteristic of selectivity polarization. Specifically, under the TM mode (the electric field of the incident light is perpendicular to the metal grating), there is the resonance in the localized surface plasmon mode between the island metal structures 265 with rectangular and the flat metal layer 22, and therefore, the incident light matching the resonance mode will be absorbed.

Figure 2D:
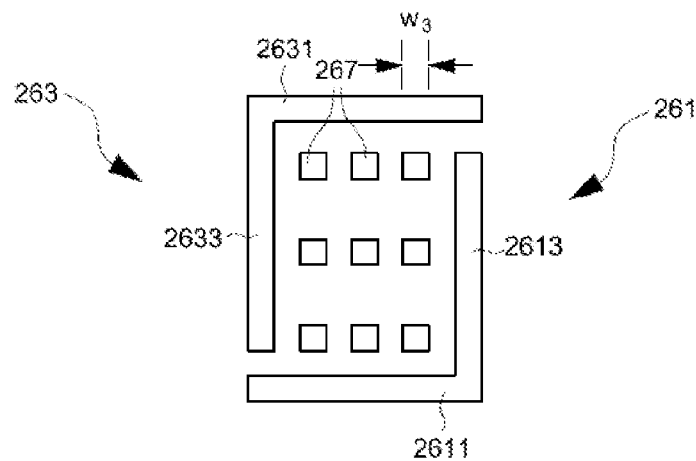
FIG. 2D illustrates a top view of the pattern metal layer in the photo detector according to the second embodiment.
Figure 2E:
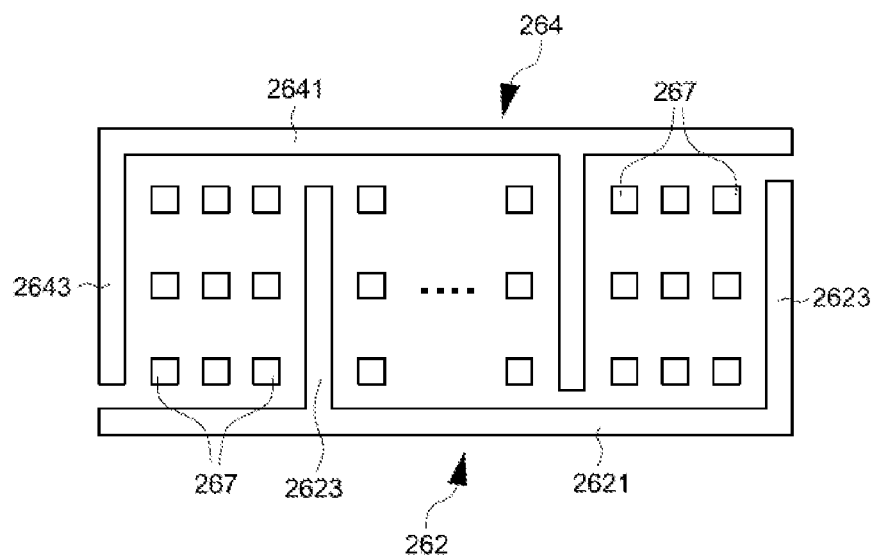
FIG. 2E illustrates a top view of the pattern metal layer in the photo detector according to the second embodiment.
Figure 2F:
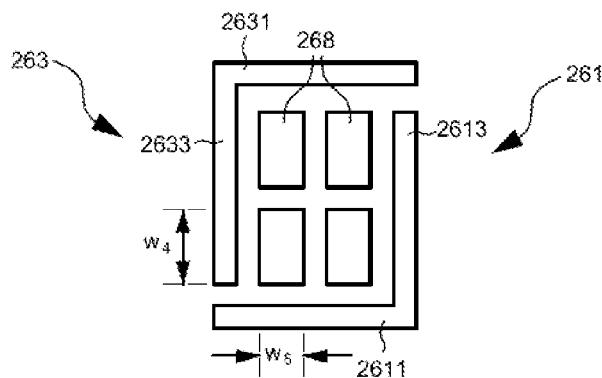
FIG. 2F illustrates a top view of the pattern metal layer in the photo detector according to the second embodiment.
Figure 2G:
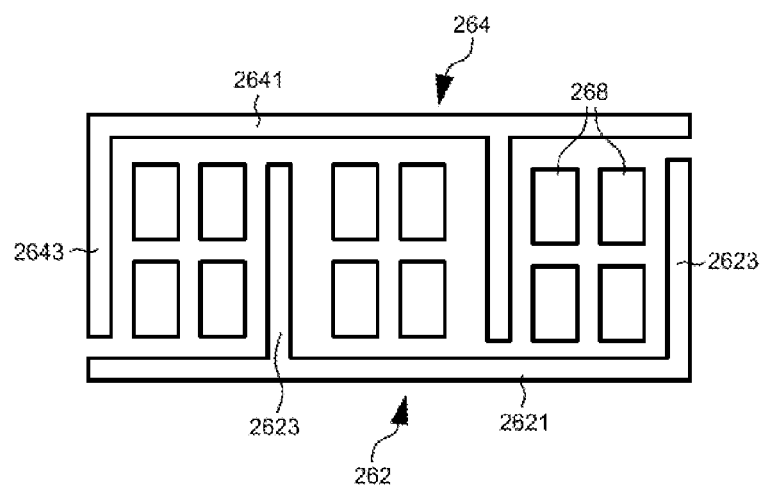
FIG. 2G illustrates a top view of the pattern metal layer in the photo detector according to the second embodiment.
Figure 2H:
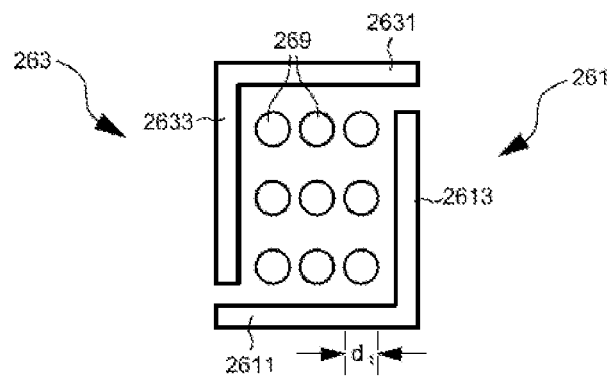
FIG. 2H illustrates a top view of the pattern metal layer in the photo detector according to the second embodiment.
Figure 2I:
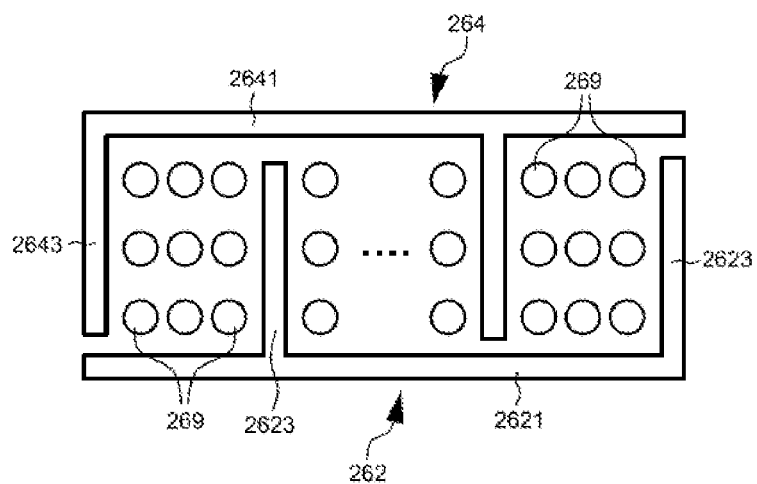
FIG. 2I illustrates a top view of the pattern metal layer in the photo detector according to the second embodiment.

Moreover, referring to FIG. 2D~2I. FIG. 2D~2I are top views of the pattern metal layers in the photo detector according to the second embodiment of the present invention. The patterned metal layer 2d~2i in the FIG. 2D~2I are similar to the patterned metal layers 26b, 26c in the FIG. 2B, 2C. The difference between them is that the island metal structures 267 on the patterned metal layer 26d, 26e are square (as shown in FIG. 2D, 2E), and the island meta structures 268 in the patterned metal layer 26f, 26g are rectangular (as shown in FIG. 2F, 2G), and the island metal structures in the patterned meta layer 26h, 26i are circular (as shown in FIG. 2H, 2I).

The embodiment is similar to the first embodiment, by adopting the dielectric layer 24 with different refractive index, adjusting the thickness $t_2$ of the dielectric layer 24, the pattern size (the line width $w_3$, the width $w_4$, the length $w_5$, the diameter $d_1$) the patterned metal layer 26 (26d~26i), the photo detector 2 is adjusted to absorb the light with different certain narrow bandwidth, for example, the single band or the multi-bands.

The embodiment is different with the previous embodiment, because the shapes of the patterned metal layers 26d to 26i are not the bar shapes and these patterned metal layers can not be as the metal gratings, the island metal structures 267, 268, 269 on the patterned metal layer 26d~26i and the flat metal layer 22 are only operated in the localized surface plasmon mode, and the thickness $t_2$ of the dielectric layer 24 is 0.1~400 nanometer.

Beside, it may decide the two resonance wavelengths and two resonance directions by designing the length $w_4$ and width $w_5$ of the rectangular island metal structure 268.

Figure 3:
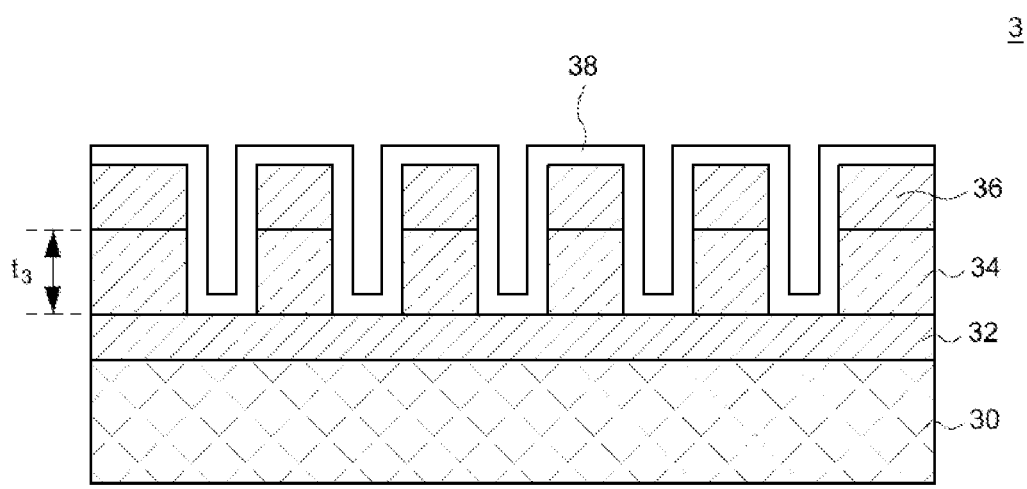
FIG. 3 illustrates a photo detector according to third embodiment of the present invention.

Afterward, referring to FIG. 3, which illustrates a photo detector according to third embodiment of the present invention. The photo detector 3 comprises a substrate 30, a flat metal layer 32, a patterned dielectric layer 34, a patterned metal layer 36 and a semiconductor film 38. The flat metal layer 32 is formed on the substrate 30, and the patterned dielectric layer 34 distributed on the flat metal layer 32. The patterned metal layer 36 is formed on the patterned dielectric layer 34, and the semiconductor film 38 is formed on the flat metal layer 32 and covers the patterned dielectric layer 34 and the patterned metal layer 36.

The structure, process and detecting optical principle of the photo detector 3 in the third embodiment is similar to the photo detector 1 in the first embodiment. The flat metal layer 32 and the patterned metal layer 36 are operated in a localized surface plasmon mode or a waveguide mode for absorbing a certain narrow bandwidth radiation light of the incident light, and therefore, the electrical conductivity of the semiconductor film 38 is changed and the optical energy absorbed by the photo detector 3 is determined. The difference between the photo detector 3 and the photo detector 1 is that the photo detector 3 allows the flat metal layer 32 and the patterned metal layer 36 to be as the first electrode and the second electrode, and the pattern of the patterned dielectric layer 34 is equal to the patterned metal layer 36.

By adopting the dielectric layer 34 with different refractive index, adjusting the thickness $t_3$ of the dielectric layer 34, the pattern size of the pattern metal layer 36, the photo detector 3 is adjusted to absorb the light with different certain narrow bandwidth, for example, the single band or the multi band. Beside, by designing the thickness $t_3$ of the dielectric layer 34, it allows the pattern metal layer 36 and the flat metal layer 32 are operated in different modes, for example, the localized surface plasmon mode or the waveguide mode.

When the semiconductor film 38 receives the incident light, the flat metal layer 32 and patterned metal layer 36 are operated in the localized surface plasmon mode or the waveguide mode for absorbing a certain narrow bandwidth radiation light of the incident light, so as to change the electrical conductivity of the semiconductor film 38. The DC bias is applied to the first electrode (the flat metal layer 32) and the second electrode (the pattern metal layer 36), and then the current of the semiconductor film 38 under the fixed bias is measured to obtain the resistance of the semiconductor film 38 and the optical energy absorbed by the photo detector 3. Thereby, the purpose of absorbing the light with the narrow bandwidth is achieved without using the optical filters According to one embodiment, the patterned metal layer 36 comprises a plurality of island structures, and the shape of each of the island structure is rectangular, interdigitated, square, circular, etc.

Figure 4:
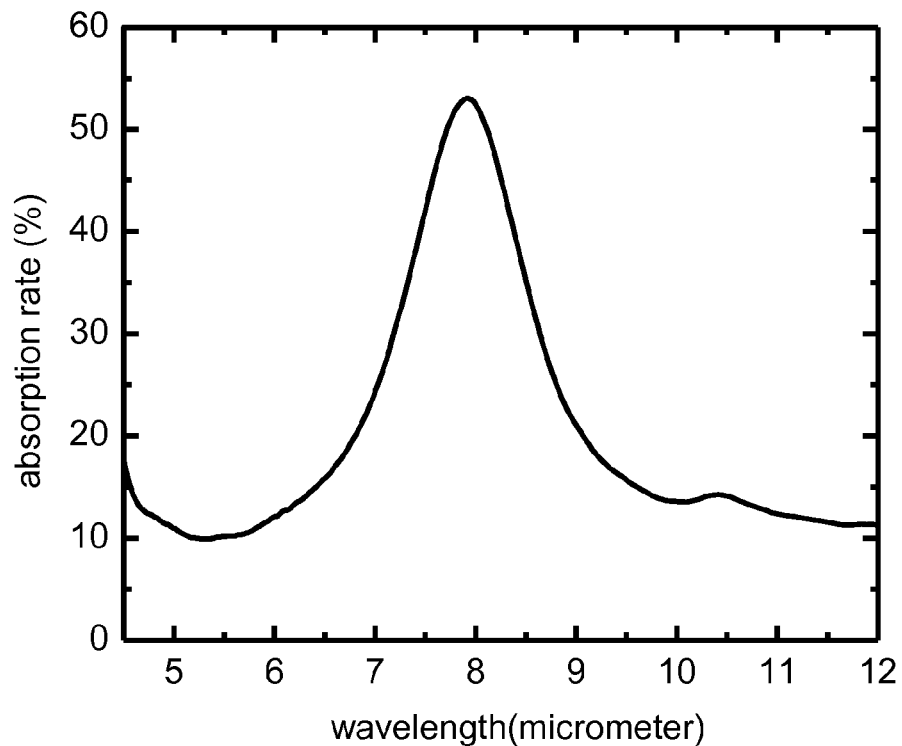
FIG. 4 illustrates the absorption spectrogram of the photo detector according to one embodiment of the present invention.

Next, referring to FIG. 4, the FIG. 4 illustrates the absorption spectrum of the photo detector according to one embodiment of the present invention. The absorption spectrum generated by the Fourier transform infrared spectroscopy proves the photo of the present invention may absorb the light in the certain narrow bandwidth obviously. For example, about 8 micrometer, and other light with non-absorption wavelength are mostly reflected and not absorbed by the photo detector.

Figure 5:
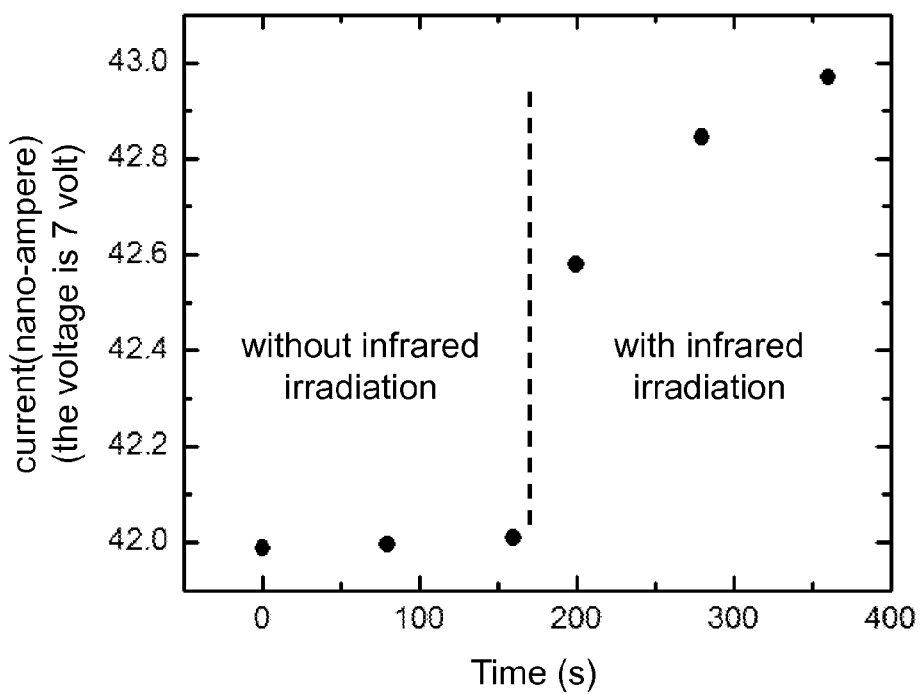
FIG. 5 illustrates the characteristic diagram of the light radiating time—current of the photo detector according to one embodiment of the present invention

Lastly, referring to FIG. 5, the FIG. 5 illustrates the characteristic diagram of the time—current of the photo detector according to one embodiment of the present invention. For performing the electrical measurement, the photo detector (1, 2, 3) is mounted on the platform, and the fixed DC voltage is respectively applied on the first electrode and the second electrode. The electrode and the island metal structure heat on the semiconductor film to change the temperature and electrical conductively after absorbing light via the photo detector. The currents of the first electrode and the second electrode are measured under the fixed bias, so as to determine whether the photo detector absorbs the light and determine how much optical energy are absorbed for achieving the purpose of detecting the light.

Referring to FIG. 5, under the fixed bias, as the light irradiation time increases, so does the current of the photo detector. Meanwhile, the resistance is decreased with increasing the light irradiation time. As a result, along with the increase of the light irradiation time, the electrical conductively is increased.

Thereby, the photo detectors mentioned combines with the resistive temperature detector and the three-layer structure (metal/dielectric layer/metal) with the function of absorbing the narrow bandwidth infrared, and then deposit a semiconductor film to be as the thermal material. When the photo detector receives the incident light, the temperature of the photo detector is increased. The temperature of the semiconductor is measured to change the resistance for achieving to detect the absorbing result of measuring the narrow bandwidth in the room temperature environment because of the increase of the temperature. Moreover, the photo detector with the characteristic of absorbing the certain narrow bandwidth light is manufactured by adjusting the structure parameters and the material of the element.

Although specific embodiments have been illustrated and described, it will be obvious to those skilled in the art that various modifications may be made without departing from what is intended to be limited solely by the appended claims.

What is claimed is:

1. A photo detector, comprising:
 a substrate;
 a flat metal layer, formed on the substrate;
 a dielectric layer, formed on the flat metal layer;
 a patterned metal layer, form on the dielectric layer, comprising a first interdigitated electrode and a second interdigitated electrode,
 wherein the first interdigitated electrode is adjacent to the second interdigitated electrode; and
 a semiconductor film, formed on the dielectric layer, covering the first interdigitated electrode and the second interdigitated electrode;
 wherein when the semiconductor film receives an incident light, the flat metal layer and the patterned metal layer are operated in the localized surface plasmon mode or a waveguide mode for absorbing a certain narrow bandwidth radiation light of the incident light, and therefore, the electrical conductivity of the semiconductor film is changed and the optical energy absorbed by the photo detector is determined.

2. The photo detector according to claim 1, wherein the flat metal layer and the patterned metal layer materials has light reflection and electrical conductivity characteristics, and the flat metal layer and the patterned metal layer thicknesses are 10~200 nanometer.

3. The photo detector according to claim 1, wherein the flat metal layer and the patterned metal layer comprises Au, Ag, Al, Pt, Cr, Ti, W, Ta, Cu, Co, Ni, Fe or Mo.

4. The photo detector according to claim 1, wherein the semiconductor film material has the characteristic of the electronic property varied with the temperature, and the semiconductor film thickness is 10~500 nanometer.

5. The photo detector according to claim 1, wherein the semiconductor film material is monocrystalline silicon, polycrystalline silicon, amorphous silicon, microcrystalline silicon, Ge, SiGe, ZnO or VO.

6. The photo detector according to claim 1, wherein the dielectric layer material is the insulation dielectric, the dielectric layer thickness is 0.1 nanometer~3 micrometer.

7. The photo detector according to claim 1, wherein the dielectric layer material is $SiO_2$, $Si_3N_4$ or $Al_2O_3$.

8. The photo detector according to claim 1, wherein the first interdigitated electrode comprises a first bar portion and a first finger portion, and one terminal of the first finger portion is connected to one side of the first bar portion, and the second interdigitated electrode comprises a second bar portion and a second finger portion, one terminal of the second finger portion is connected to one side of the second bar portion, and the first bar portion is relative to the second bar portion, and the first finger portion is relative to the second finger portion.

9. The photo detector according to claim 8, wherein the line width of the first bar portion, the first finger portion, the second bar portion and the second finger portion is 0.1~100 micrometer.

10. The photo detector according to claim 1, wherein the first interdigitated electrode comprises a first bar portion and a plurality of first finger portions, one terminal of each first finger portion is connected to one side of the first bar portion, and the second interdigitated electrode comprises a second bar portion and a plurality of second bar portions, one terminal of each second finger portion is connected to one side of the second bar portion, and the first interdigitated electrode is relative to the second interdigitated electrode, the plurality of first finger portions are relative to the plurality of second finger portions.

11. The photo detector according to claim 1, wherein the line width of the each first finger portion or the each second finger portions is 0.1~100 micrometer, and the period thereof is 0.2~1000 micrometer.

12. The photo detector according to claim 8 or 10, wherein the thickness of the dielectric layer is 0.1~400 nanometer, the flat metal layer and the pattern metal layer are operated in the localized surface plasmon mode.

13. The photo detector according to claim 8 or 10, wherein the thickness of the patterned dielectric layer is 0.1 nanometer~3 micrometer, and the flat metal layer and the pattern metal layer are operated in the waveguide mode.

14. A photo detector, comprising:
a substrate;
a flat metal layer, formed on the substrate;
a dielectric layer, formed on the flat metal layer;
a pattern metal layer, from the dielectric layer, comprising a first interdigitated electrode, a second interdigitated electrode and a plurality of island metal structures, wherein the plurality of island metal structures are located between the first interdigitated electrode and the second interdigitated electrode; and
a semiconductor film, formed on the dielectric layer, covering the first interdigitated electrode, the second interdigitated electrode and plurality of island metal structures;
wherein when the semiconductor film receives an incident light, the flat metal layer and the plurality of island metal structures are operated in a localized surface plasmon mode or a waveguide mode for absorbing a certain narrow bandwidth radiation light of the incident light, and therefore, the electrical conductivity of the semiconductor film is changed and the optical energy absorbed by the photo detector is determined.

15. The photo detector according to claim 14, wherein the flat metal layer and the patterned metal layer materials has light reflection and electrical conductivity characteristics, and the flat metal layer and the patterned metal layer thicknesses are 10~200 nanometer.

16. The photo detector according to claim 14, wherein the flat metal layer and the patterned metal layer comprises Au, Ag, Al, Pt, Cr, Ti, W, Ta, Cu, Co, Ni, Fe or Mo.

17. The photo detector according to claim 14, wherein the semiconductor film material has the characteristic of the electronic property varied with the temperature, and the semiconductor film thickness is 10~500 nanometer.

18. The photo detector according to claim 14, wherein the semiconductor film material is monocrystalline silicon, polycrystalline silicon, amorphous silicon, microcrystalline silicon, Ge, SiGe, ZnO or VO.

19. The photo detector according to claim 14, wherein the dielectric layer material is the insulation dielectric, the dielectric layer thickness is 0.1 nanometer~3 micrometer.

20. The photo detector according to claim 14, wherein the dielectric layer is $SiO_2$, $Si_3N_4$ or $Al_2O_3$.

21. The photo detector according to claim 14, wherein the first interdigitated electrode comprises a first bar portion and a first finger portion, and one terminal of the first finger portion is connected to one side of the first bar portion, and the second interdigitated electrode comprises a second bar portion and a second finger portion, one terminal of the second finger portion is connected to one side of the second bar portion, and the first bar portion is relative to the second bar portion, and the first finger portion is relative to the second finger portion.

22. The photo detector according to claim 21, wherein each of the plurality of island metal structures is rectangular, and the plurality of island metal structures are respectively parallel to the first finger portion and the second finger portion.

23. The photo detector according to claim 21, wherein the patterned metal layer comprises a plurality of island structures and each island structure shape is square or circular.

24. The photo detector according to claim 22 or 23, wherein the line widths of the first bar portion, the first finger portion, the second bar portion, the second finger portion and the plurality of the island structures are 0.1~100 micrometer, and the periods of the plurality of the island structures are 0.2~200 micrometer.

25. The photo detector according to claim 14, wherein the first interdigitated electrode comprises a first bar portion and a plurality of first finger portions, one terminal of each first finger portion is connected to one side of the first bar portion, and the second interdigitated electrode comprises a second bar portion and a plurality of second bar portions, one terminal of each second finger portion is connected to one side of the second bar portion, and the first interdigitated electrode is relative to the second interdigitated electrode, the plurality of first finger portions are relative to the plurality of second finger portions.

26. The photo detector according to claim 25, wherein each of the plurality of island metal structures is rectangular, and the plurality of island metal structures are respectively parallel to the first finger portion and the second finger portion.

27. The photo detector according to claim 25, wherein each of the plurality of island structures shape is square or circular.

28. The photo detector according to claim 26 or 27, wherein the line widths of the first finger portion, the second finger portion and the plurality of the island structures are 0.1~100 micrometer, and the periods of the plurality of the island structures are 0.2~200 micrometer.

29. The photo detector according to claim 22, 23, 26 or 27, wherein the dielectric layer thickness is 0.1~400 nanometer, and the flat metal layer and the plurality of island metal structures are operated in the localized surface plasmon mode.

30. The photo detector according to claim 22 or 26, wherein the dielectric layer thickness is 0.1 nanometer~3 micrometer, and the flat metal layer and the pattern metal layer are operated in the waveguide mode.

31. A photo detector, comprising:
a substrate;
a flat metal layer, formed on the substrate;
a patterned dielectric layer, distributed on the flat metal layer;
a patterned metal layer, formed on the patterned dielectric layer; and
a semiconductor film, formed on the flat metal layer, covering the patterned dielectric layer and the patterned metal layer;
wherein when the semiconductor film receives an incident light, the flat metal layer and the patterned metal layer are operated in a localized surface plasmon mode or a waveguide mode for absorbing a certain narrow bandwidth radiation light of the incident light, and therefore, the electrical conductivity of the semiconductor film is changed and the optical energy absorbed by the photo detector is determined.

32. The photo detector according to claim 31, wherein the flat metal layer and the patterned metal layer materials has light reflection and electrical conductivity characteristics, and the flat metal layer and the patterned metal layer thicknesses are 10~200 nanometer.

33. The photo detector according to claim 31, wherein the flat metal layer and the patterned metal layer comprises Au, Ag, Al, Pt, Cr, Ti, W, Ta, Cu, Co, Ni, Fe or Mo.

34. The photo detector according to claim 31, wherein the semiconductor film material has the characteristic of the electronic property varied with the temperature, and the semiconductor film thickness is 10~500 nanometer.

35. The photo detector according to claim 31, wherein the semiconductor film material is monocrystalline silicon, polycrystalline silicon, amorphous silicon, microcrystalline silicon, Ge, SiGe, ZnO or VO.

36. The photo detector according to claim 31, wherein the patterned dielectric layer material is the insulation dielectric, the patterned dielectric layer thickness is 0.1 nanometer~3 micrometer.

37. The photo detector according to claim 31, wherein the patterned dielectric layer is $SiO_2$, $Si_3N_4$ or $Al_2O_3$.

38. The photo detector according to claim 31, wherein the pattern metal layer comprises a plurality of island structures and each island structure shape is rectangular or interdigitated.

39. The photo detector according to claim 31, wherein the pattern metal layer comprises a plurality of island structures and each island structure shape is square or circular.

40. The photo detector according to claim 38 or 39, wherein the line widths of the island structures are 0.1~100 micrometer, and the periods thereof are 0.2~200 micrometer.

41. The photo detector according to claim 38 or 39, wherein the patterned dielectric layer thickness is 0.1~400 nanometer, and the flat metal layer and the pattern metal layer are operated in the localized surface plasmon mode.

42. The photo detector according to claim 38 or 39, wherein the patterned dielectric layer thickness is 0.1 nanometer~3 micrometer, and the flat metal layer and the pattern metal layer are operated in the waveguide mode.

* * * * *